(12) United States Patent
Schmitt et al.

(10) Patent No.: US 8,467,175 B2
(45) Date of Patent: Jun. 18, 2013

(54) SYSTEM AND METHOD FOR AN OPTIMIZABLE RACK SOLUTION

(75) Inventors: Ty Schmitt, Round Rock, TX (US); Mark M. Bailey, Burnet, TX (US); Anthony Middleton, Round Rock, TX (US); Edmond Bailey, Cedar Park, TX (US); Laurent Regimbal, Round Rock, TX (US); Tyler Duncan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 201 days.

(21) Appl. No.: 13/022,211

(22) Filed: Feb. 7, 2011

(65) Prior Publication Data

US 2012/0201002 A1 Aug. 9, 2012

(51) Int. Cl.
*H05K 7/14* (2006.01)
*H05K 7/20* (2006.01)

(52) U.S. Cl.
USPC ...... 361/679.02; 361/692; 361/730; 361/741; 361/724; 712/223.1; 712/223.2; 712/334.29; 712/205

(58) Field of Classification Search
USPC ............... 361/679.01, 679.02, 679.46–679.5, 361/690–695, 700–727, 831; 312/223.1, 312/223.2, 111, 108, 198, 236, 205, 265.3, 312/265, 333; 211/26, 183; 174/50, 520; 454/184
See application file for complete search history.

(56) References Cited

U.S. PATENT DOCUMENTS

| | | | | |
|---|---|---|---|---|
| 5,216,579 | A * | 6/1993 | Basara et al. | 361/679.46 |
| 5,938,302 | A * | 8/1999 | Anderson et al. | 312/223.1 |
| 6,421,243 | B1 * | 7/2002 | Ives et al. | 361/725 |
| 6,443,542 | B1 * | 9/2002 | Lindquist et al. | 312/198 |
| 6,678,161 | B1 * | 1/2004 | Claprood et al. | 361/724 |
| 6,769,551 | B2 * | 8/2004 | Rafferty et al. | 211/26 |
| 6,955,410 | B1 * | 10/2005 | Nelson et al. | 312/352 |
| 2006/0119239 | A1 * | 6/2006 | Werwick | 312/334.29 |
| 2011/0115345 | A1 * | 5/2011 | Kang | 312/205 |

OTHER PUBLICATIONS

The rack shown in the document attached to this statement was offered for sale as early as Jul. 2009.

* cited by examiner

*Primary Examiner* — Michail V Datskovskiy
(74) *Attorney, Agent, or Firm* — Baker Botts L.L.P.

(57) ABSTRACT

In accordance with the present disclosure, a system and method for an optimizable rack solution is presented. The system and method is directed to an optimizable rack that includes a frame. The frame has both a primary portion and a detachable portion. The primary portion may contain a primary enclosure and the detachable portion may container a secondary enclosure. Each of the primary enclosure and secondary enclosure are sized to hold a plurality of computing systems. Detaching the detachable portion of the frame both reduces the size and computing systems capacity of the frame.

13 Claims, 5 Drawing Sheets

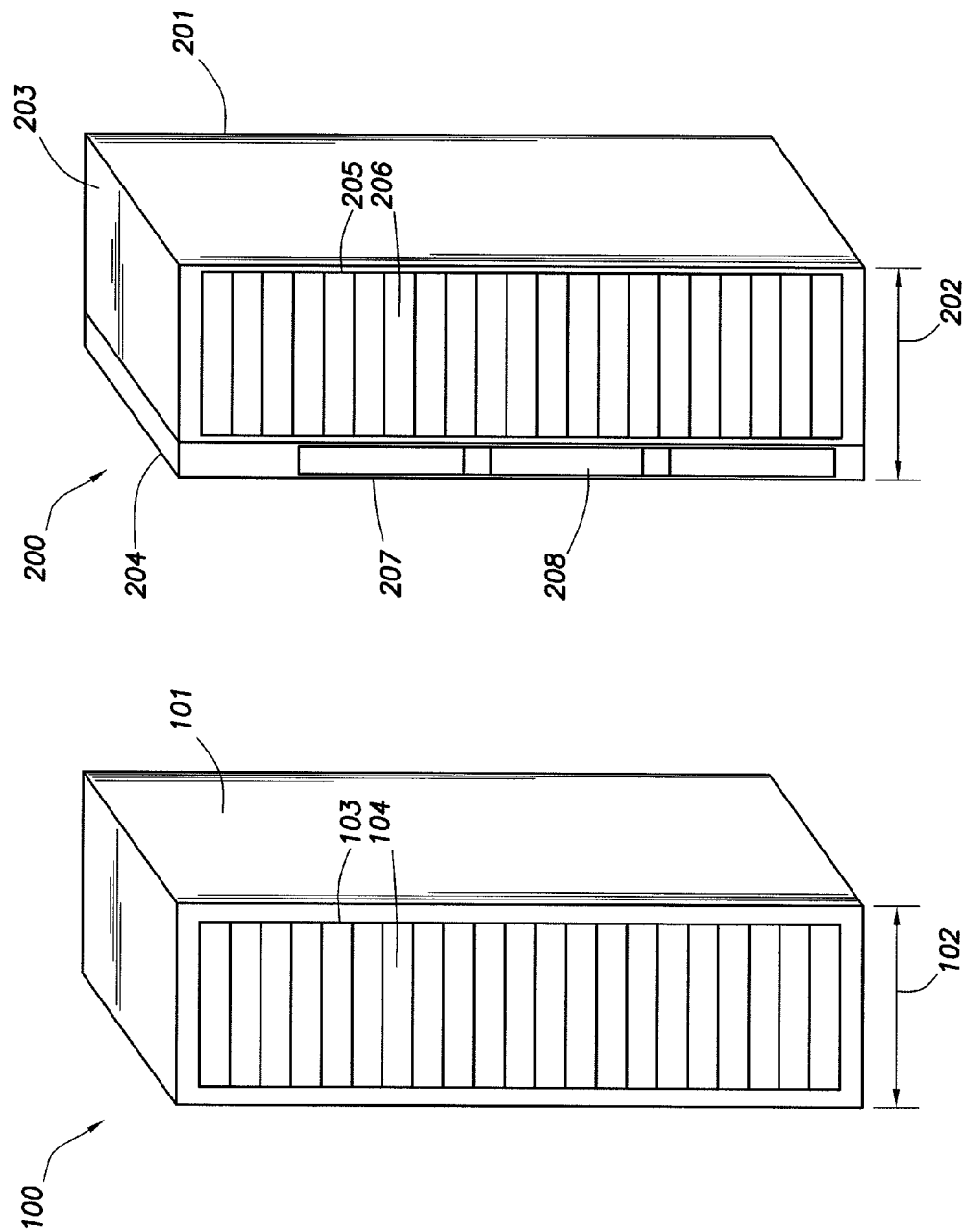

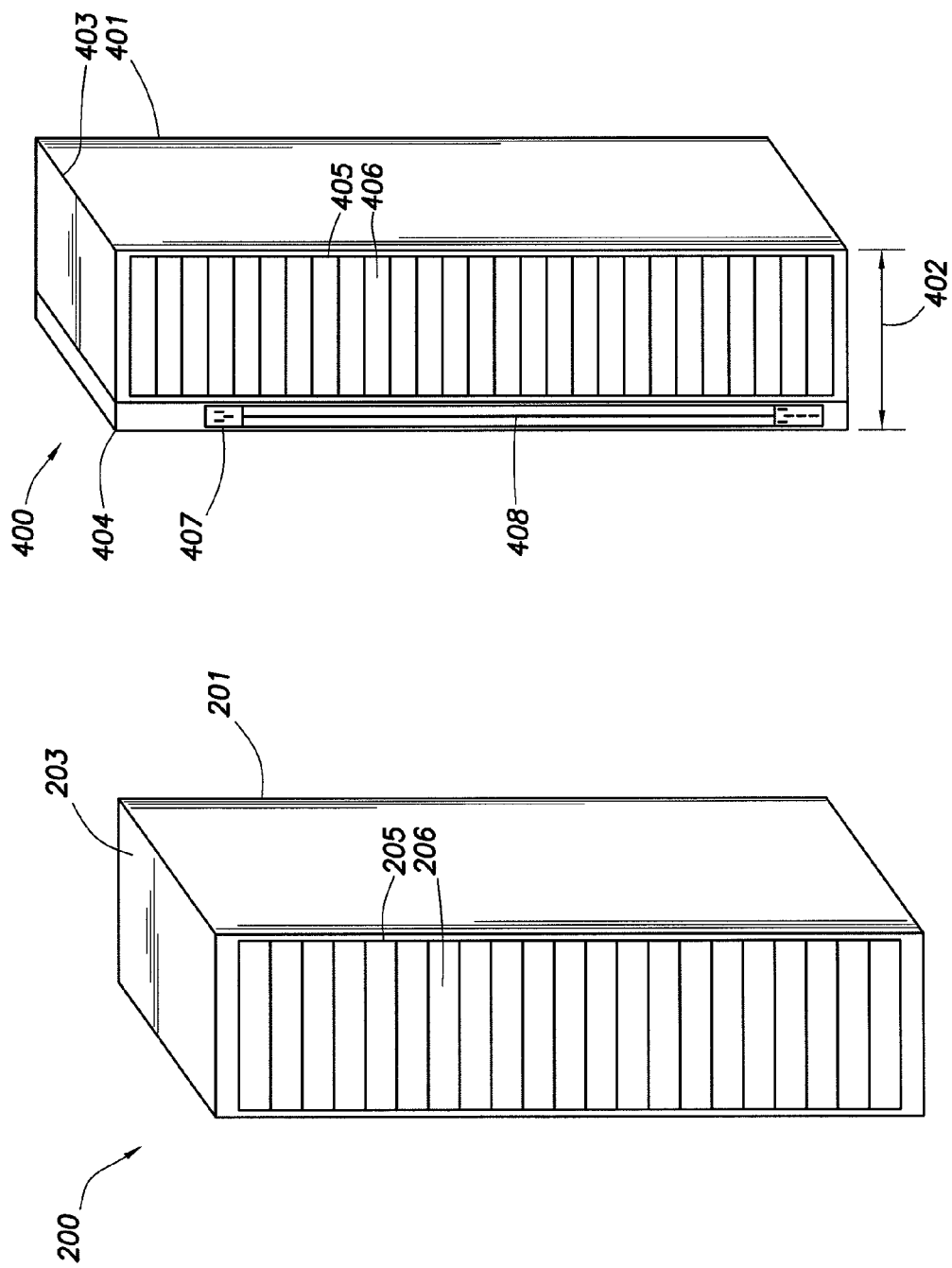

SYSTEM AND METHOD FOR AN OPTIMIZABLE RACK SOLUTION

CROSS REFERENCES TO RELATED APPLICATIONS

This application is related to co-pending U.S. patent application Ser. No. 13/022,018 entitled "System and Method for Designing a Configurable Modular Data Center" which was filed on Feb. 7, 2011, U.S. patent application Ser. No. 13/021,971 entitled "System and Method for Concurrent Manufacturing, Testing, and Integration of a Modular Data Center" which was filed on Feb. 7, 2011, U.S. patent application Ser. No. 13/033,451 entitled "System and Method for a Modular Fluid Handling System with Modes in a Modular Data Center" which was filed on Feb. 23, 2011, and U.S. patent application Ser. No. 13/022,136 entitled "System and Method for Structural, Modular Power Distribution in a Modular Data Center", which was also filed on Feb. 7, 2011, all of which are incorporated herein by reference for all purposes.

TECHNICAL FIELD

The present disclosure relates generally to the operation of computer systems and information handling systems, and, more particularly, to a system and method for an optimizable rack solution.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

Information handling systems (e.g., servers) are commonly designed for mounting in racks. Data centers typically require numerous racks populated with many information handling systems to provide the necessary computing power. The most common type of information handling system to be included in a data center is a standard 19-inch wide server, which is widely available and generally interchangeable across brands. The height of the standard 19-inch wide server depends on the server design, but is measured in terms of rack units, or "U", where one U is approximately 1.75 inches. The standard 19-inch servers are typically housed in standard racks, which generally include a box-like frame in which the standard servers are mounted horizontally in a vertically stacked arrangement. The equipment capacity of a standard rack thus depends on the height of the rack, and standard racks typically hold 42 U worth of standard 19-inch servers.

Standard racks are beneficial because they are widely available. One problem with standard racks, however, is that they have a fixed structure, which fixes the footprint and the capacity of the rack. This is particularly problematic where space and computing density are primary concerns, such as in a containerized data center, which is typically constructed in a shipping container. For example, fully populating a containerized data centers with standard racks may not provide the necessary computing density, and standard racks cannot be optimized to increase the density. Additionally, the structure of the standard rack generally cannot be optimized for design concerns prevalent in a containerized data center, where space is at a premium, such as how to integrate the rack within a containerized data center and how to account for the power and cooling needs of the information handling systems within the rack.

SUMMARY

In accordance with the present disclosure, a system and method for an optimizable rack solution is presented. The system and method is directed to an optimizable rack that includes a frame. The frame has both a primary portion and a detachable portion. The primary portion may contain a primary enclosure and the detachable portion may container a secondary enclosure. Each of the primary enclosure and secondary enclosure are sized to hold a plurality of computing systems. Detaching the detachable portion of the frame both reduces the size and computing systems capacity of the frame.

The system and method disclosed herein is technically advantageous because it provides a system and method for a rack that can be optimized for a given solution. In particular, the size and computing system capacity can be optimized according to space limitations in a data center. When the detachable portion is included, the optimizable rack may offer computing systems capacity that is higher than a standard server. When the detachable portion is not included, the computing system density of the optimized rack may be higher than that of a standard server, because the floorspace occupied by the optimized rack may be narrowed. Additionally, as will be seen, the optimizable rack is beneficial because it can be sized to fit standard 19-inch wide servers, meaning that the capacity and density of computing systems within a data center can be increased, without requiring proprietary or custom sized computing solutions. Additionally, because the rack is optimizable, it can be optimized for a variety of different data centers, including modular data centers, and the frame of the optimizable rack may be optimized to include mounting and integration elements. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1 is one example of a prior art standard rack.

FIG. 2 is one embodiment of an optimizable rack according to one aspect of the present invention.

FIG. 3 is another embodiment of an optimizable rack according to aspects of the present invention.

FIG. 4 is another embodiment of an optimizable rack according to aspects of the present invention.

DETAILED DESCRIPTION

Figure 5:
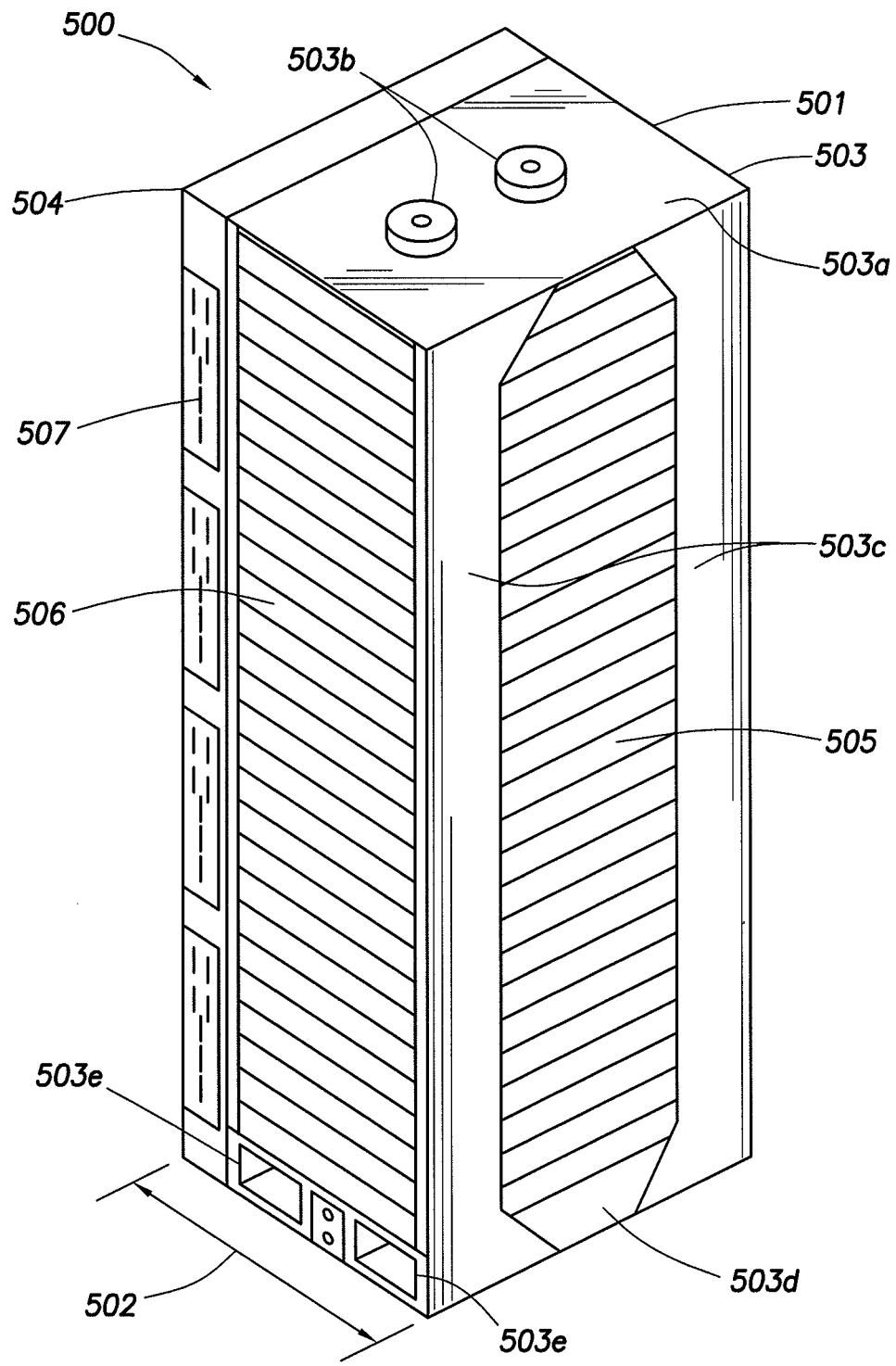
FIG. 5 is a preferred embodiment of an optimizable rack according to aspects of the present invention.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Shown in FIG. 1 is the front view of a standard rack 100. The standard rack 100 includes a frame 101, a rectangular cuboid, with an outside width 102 of approximately 24 inches. The frame 101 includes an enclosure 103, which is approximately 19 inches wide. Standard 19-inch servers 104, may be inserted into the enclosure 103 and mounted in the standard rack 100, as shown. The standard 19-inch servers 104 are each 2 U tall. As can be seen, there are 21 of the standard 19-inch servers 104, meaning that the computing capacity of standard rack 100 is 42 U, as is typical. Stated another way, the enclosure 103 is 42 U tall. As can also be seen, the standard 19-inch servers 104 do not fill the entire 24 inch width of the standard rack 100. Rather, there is a similarly sized space on both sides of the standard 19-inch servers called "zero U" space, which is defined by the sides of the standard 19-inch servers and the frame 101. This space is problematic in limited space environments, because it wastes space within footprint of the standard rack. Utilizing and/or minimizing this "zero U" space is one benefit of the present invention.

FIG. 2 is an optimizable rack 200 according to one embodiment of the present invention. The optimizable rack 200 includes a frame 201, with dimensions that are generally the same as that of the frame 101 of the standard rack. Namely, the frame 201 includes an outer width 202 of 24 inches. The frame 201 also includes a primary portion 203 and a detachable portion 204. The primary portion includes a primary enclosure 205, which has a computing capacity of 42 U, like the enclosure 103 of the standard rack 100, holding 21 2 U standard 19-inch wide racks 206. Unlike the enclosure 103 of standard rack 100, however, the primary enclosure 205 of optimizable rack 200 is offset across the width 202 of the frame 201. Offsetting the primary enclosure 205 across the width 202 of frame 201 is beneficial, because it forms one large "zero U" space on one side of the frame 201 in which additional elements may be installed.

What would be the "zero U" space of the optimizable rack 200 may be populated with a variety of computing equipment, such as additional servers, repackaged power distribution devices, switches, etc. In the embodiment shown, the "zero U" space of the optimizable rack 200 includes a detachable portion 204 of frame 201. The detachable portion 204 of frame 201 may be attached—on either side of the primary portion—with any well known attachment mechanism, including bolts that extend through the primary portion 203 and into the detachable portion 204 or vice versa. The detachable portion 204 includes a secondary enclosure 207. The secondary enclosure 207 may be populated with three additional 2 U standard 19-inch servers 208, installed vertically within the optimizable rack 200. In other embodiments, the secondary enclosure 207 can be customized to hold either servers 208, power distribution equipment, other optimized equipment, or some combination thereof, as will be shown. In either case, as is clearly shown, offsetting the primary enclosure 205 across the width of the frame, and including a secondary enclosure 207 may increase the computing system capacity by 6 U compared to a standard rack, thereby providing an overall computing capacity for the optimizable rack of 48 U on the same footprint as that of standard rack 100, which has a capacity of 42 U.

FIG. 3 illustrates the optimizable rack 200 of FIG. 2 with the detachable portion 204 removed. This configuration may be referred to as a "narrow rack" configuration, because without the detachable portion 204, the width of the optimizable rack is decreased, as the optimizable rack now only include the primary portion 203 of the frame 201. The width of just the primary enclosure 203 portion of the optimizable rack may be approximately 20.5 inches (24 inches with the detachable portion 204 included—at least 3.5 inches, or the 2 U worth of space provided via the secondary enclosure 207). The narrow rack configuration may be highly beneficial when multiple racks are needed and computing density is of the highest concern. For example, in the "narrow rack" configuration shown in FIG. 3, the computing density of the "narrow rack" may be approximately 2.05 U/inch of width (42 U/20.5 inch width) compared to 2 U/inch of width for the optimizable rack with the detachable portion 204 included (48 U/24 inch width) and 1.75 U/inch of width in a standard rack (42 U/24 inch width).

FIG. 4 illustrates another embodiment of a optimizable rack. FIG. 4 shows a optimizable rack 400 with a frame 401. The frame 401 may include an outer width 402 of 24 inches, like the standard rack shown earlier. The frame 401 also includes a primary portion 403 and a detachable portion 404. The optimizable rack 400 also includes a primary enclosure 405 offset across the width 402 of the frame 401, such that it is disposed in the primary portion 403 of frame 401. Unlike the optimizable rack of FIGS. 2 and 3, where the primary enclosures had a computing system capacity of 42 U, however, the computing system capacity of primary enclosure 405 is 54 U, accommodating up to 27 separate 2 U standard 19-inch servers 406, as shown. Other embodiments may include optimizable racks including primary enclosures with a variety of U capacities, and the examples shown herein should not be seen as limiting.

Detachable portion 404 includes a plurality of power distribution elements attached on the outside of the detachable portion 404. In particular, the power distribution elements include power connection points 407. The power connection points may be included on a strip that extends some or all of the height of detachable portion 404. The power connection points may be wired to provide power to the servers 406 within the primary enclosure or to any servers within a secondary enclosure of the detachable portion 404. The power distribution elements also include a power distribution unit 408, which connects some or all of the power connection points 407. The power distribution unit 408 may be included so that power can be included in one of the power connection points 407 and transmitted to each of the other power connection points 408 via the power distribution unit 408. The detachable portion 404 of the optimizable rack 400 may also include a secondary enclosure that is reachable through the side of the detachable portion 404 opposite the power distribution elements. Because of the increased height of the detachable unit 404, the secondary enclosure may include a computing capacity of up to 8 U, including space for up to 4 standard 19-inch servers. With the 4 standard 19-inch servers included, the optimizable rack 400 has a capacity of approximately 2.59 U/inch of width (62 U/24 inch width). With the detachable portion removed, the optimizable rack has a capacity of approximately 2.63 U/inch of width (54 U/20.5).

FIG. 5 is one embodiment of an optimizable rack according to one aspect of the present invention. In particular, the optimizable rack 500 includes a frame 501. The width 502 of frame 501 may be 24 inches. The frame 501 includes primary portion 503 and detachable portion 504. Primary portion 503 may include a top 503a, which incorporate a mounting element, mounting rollers 503b. The primary portion 503 may also include side members 503c. Side members 503c may also be included on the side of the primary portion 503 adjacent to the detachable portion 504. Each of the side members 503c may be attached to the top of the primary portion 503a and the base of the primary portion 503d. The base of the primary portion 503e may include integration elements, such as fork lift slots 503e. The fork lift slots may be covered on the side of the rack facing away, to prevent a fork lift from stabbing through. The integration elements may also include a channel disposed between the fork lift slots, open on the side of the rack facing away and covered by plate 503f, which includes bores for bolts.

Each of the mounting elements and the integration elements can be optimized to fit a mounting solution and an integration solution for a particular data center. The mounting rollers 503b, fork lift slots 503f, and channel with plate 503f are preferred embodiments for mounting element and integration element for the modular data center described in cross-referenced application entitled "System and Method for Designing a Configurable Modular Data Center" and the integration process described in cross-referenced application entitled "System and Method for Concurrent Manufacturing, Testing, and Integration of a Modular Data Center," respectively. Although the location an type of mounting and integration element can change, it is preferable to include both the mounting and integration element on the primary portion of the optimizable rack, so that each of the elements may be used even if the detachable portion is not included in the optimizable rack. One advantage of an optimizable rack according to the present invention is that it can be optimized to include a variety of different mounting and integration elements, as opposed to a standard rack, such as the one shown in FIG. 1, which is designed to fit into a variety of locations instead of being optimized to a particular one.

The primary portion 503 includes a primary enclosure 505, disposed within it. Mounted within the primary enclosure are standard 19-inch servers 506, that are 2 U tall. Like the optimizable rack of FIG. 4, the optimizable rack 500 includes 27 separate 2 U servers, for an overall computing capacity of 54 U. Each of the servers 506 may be mounted in the primary enclosure 505 by any of a number of well known mounting features, including tracks, shelves, etc.

The detachable portion 504 of optimizable rack 500 may be attached to the top 503a, side members 503c, base 503e of the primary portion 503, or any combination thereof. Like the optimizable rack of FIG. 4, the detachable portion 503 of the optimizable rack 500 includes power distribution elements mounted on the face of the detachable portion 503. The power distribution elements shown in FIG. 5 are power connection points 507. Unlike the optimizable rack of FIG. 4, the power distribution is not included, so as to give a better view of the power connection points 507.

An optimizable rack, such as those described above, may used in a process to optimize a data center. As shown in the flow diagram of FIG. 6, the process may include determining an amount of space available to locate racks in a data center. Standard brick and mortar data centers typically have a large amount of space to locate racks, but using optimizable racks may still be beneficial to increase the computing density of the data center. Modular data centers, such as a containerized data center built in a shipping container or a modular data center as described in the cross-referenced application entitled "System and Method for Designing a Configurable Modular Data Center", are typically limited in usable space. As such, determining the amount of space available to place the racks is critical to determining how to optimize the data center using an optimizable rack.

The method may also include determining a computing capacity needed for the data center. Computing capacity may be determined in terms of computational power, storage space, or other metrics well known in the art. This computing capacity can be translated into the number of U of computing equipment, such as standard 19-inch wide servers, that need to be included in the data center. Knowing both the amount of space to locate the racks and the amount of computing capacity needed in the data center, the computing density can be determined and used as one factor in optimizing the data center.

The method also includes the step of optimizing at least one rack according, at least in part, to the space available to locate racks with a data center and the computing capacity needed for the data center. This step may include, for example, deciding whether or not to include the detachable portion of an optimizable rack as described above. For example, for the optimizable rack shown in FIGS. 2 and 3, if the data center requires a computing density of over 2 U per inch of rack width, then the "narrow rack" configuration may be used, whereas if a computing density of 2 U or less is required, the detachable portion can be included.

Optimizing at least one rack may also include choosing between one of a plurality of pre-designed racks. For example, the optimizable rack shown in FIGS. 2 and 3, and the optimizable rack shown in FIG. 4 may be two options of the plurality of pre-designed racks. According to the computing density required, and depending on the height of the space in which the racks will be deployed, optimizing the at least one rack may include selecting the optimizable rack from FIG. 4, instead of the optimizable rack from FIGS. 2 and 3, so as to maximize the computing density per unit of rack width. Likewise, if less density is required, the optimizable rack from FIGS. 2 and 3 may be chosen. Each of the optimizable rack from FIG. 4 and the optimizable rack from FIGS. 2 and 3 can then be further optimized, such as determining whether to include the detachable portion of the optimizable rack and whether to populate the optimizable rack with servers or other computing equipment, such as power distribution elements or switched.

Figure 6:
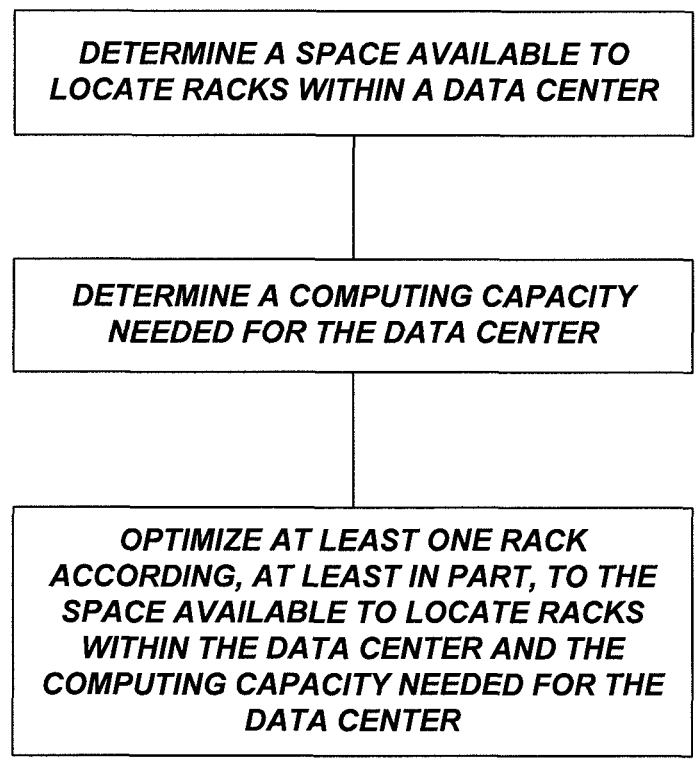
FIG. 6 is a flow diagram for a method of optimizing a modular data center according to aspect of the present invention.
Figure 7:
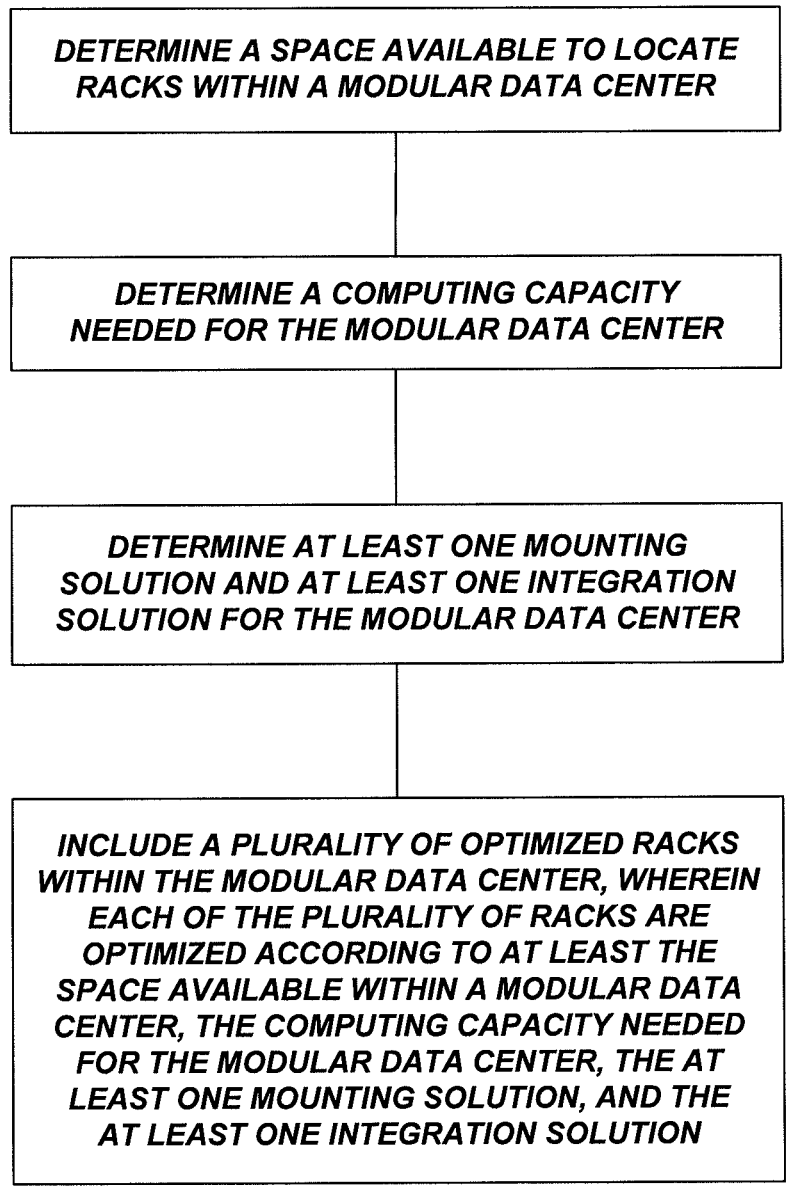
FIG. 7 is a flow diagram of a preferred method of optimizing a modular data center according to aspects of the present invention.

In a separate embodiment, as is shown in FIG. 6, the method may include determining the space available and computing capacity for a modular data center. The method may also include determining at least one mounting solution and at least one integration solution for the modular data center. Finally, the method may include the step of including a plurality of optimized racks within the modular data center, wherein each of the plurality of racks are optimized according to at least the space available within the modular data center, the computing capacity needed for the modular data center, the at least one mounting solution and the at least one integration solution. The optimizable rack shown in FIG. 4 may be an embodiment of one of the plurality of optimized racks. In particular, the optimizable rack of FIG. 4 may be optimized to include the detachable portion 504 and may be optimized according to specific mounting and integration solutions to include mounting tongues 503b and fork lift slots 503e. This is, however, but one example of an according to this invention. Many other optimizations are possible, including the removal of the detachable portion, the selection of a shorter rack, and the variability of both the mounting element and the integration element.

Optimizable racks according to aspects of the present invention are advantageous because they can sized and designed according to the requirements of the data center in which they are to be used. This can lead to the better use of space, an increase in computing density, and a variability in the way in which the racks are mounted to and integrated in data center. Other advantages will be apparent to those of ordinary skill in the art.

Although the present disclosure has been described in detail, it should be understood that various changes, substitutions, and alterations can be made hereto without departing from the spirit and the scope of the invention as defined by the appended claims.

What is claimed is:

1. A space optimizable rack, comprising:
a frame, wherein the frame includes a primary portion and a detachable portion;
a primary enclosure disposed within the primary portion;
a secondary enclosure disposed within the detachable portion;
wherein each of the primary enclosure and secondary enclosure are sized to hold a plurality of computing systems;
wherein detaching the detachable portion of the frame reduces a size and a computing system capacity of the frame;
wherein the frame has a width and a height, and the computing density of the frame when the frame includes the primary portion and the detachable portion is higher than the computing density of a non-optimized rack having the same height and width.

2. The space optimizable rack of claim 1, wherein the primary enclosure is offset across the width, and detaching the detachable portion of the frame reduces the width of the frame.

3. The space optimizable rack of claim 1, wherein each of the primary enclosure and secondary enclosure are sized to hold a plurality of standard 19-inch wide servers.

4. The space optimizable rack of claim 3, wherein the secondary enclosure includes 4×2 U of rack space.

5. The space optimizable rack of claim 1, wherein the frame includes mounting elements and integration elements.

6. The space optimizable rack of claim 1, wherein the primary portion of the frame includes airflow apertures.

7. The space optimizable rack of claim 5, wherein the integration elements include forklift slots.

8. The space optimizable rack of claim 1, wherein the secondary enclosure includes power distribution equipment and switches.

9. A space optimizable rack, comprising:
a frame, wherein the frame includes a primary portion and a detachable portion;
a primary enclosure disposed within the primary portion;
a secondary enclosure disposed within a detachable portion;
forklift slots disposed within a base of the frame;
wherein each of the primary enclosure and secondary enclosure are sized to hold a plurality of computing systems;
wherein detaching the detachable portion of the frame reduces a size and a computing system capacity of the frame;
wherein the frame has a width and a height, and the computing density of the frame when the frame includes the primary portion and the detachable portion is higher than the computing density of a non-optimized rack having the same height and width.

10. A space optimizable rack of claim 9, further comprising a channel with a mounting plate disposed in the base.

11. A space optimizable rack of claim 9, further comprising rollers attached to the top of the frame.

12. The space optimizable rack of claim 9, wherein the primary portion of the frame includes airflow apertures.

13. The space optimizable rack of claim 9, wherein the secondary enclosure includes power distribution equipment and switches.

* * * * *